(12) United States Patent
Poechmueller

(10) Patent No.: US 7,248,067 B2
(45) Date of Patent: Jul. 24, 2007

(54) SEMICONDUCTOR DEVICE WITH TEST CIRCUIT DISCONNECTED FROM POWER SUPPLY CONNECTION

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 10/946,024

(22) Filed: Sep. 21, 2004

(65) Prior Publication Data

US 2006/0061378 A1    Mar. 23, 2006

(51) Int. Cl.
*G01R 31/26* (2006.01)
(52) U.S. Cl. ........................ 324/765; 324/763
(58) Field of Classification Search ........ 324/763–765, 324/158.1, 73.1; 714/724–734, 718; 365/200–201; 702/117–120
See application file for complete search history.

(56) References Cited

U.S. PATENT DOCUMENTS 5,898,700 A * 4/1999 Kim ........................... 714/718
5,977,763 A * 11/1999 Loughmiller et al. .... 324/158.1
6,349,398 B1   2/2002 Resnick
6,570,400 B2 * 5/2003 Habersetzer et al. ........ 324/763
6,687,865 B1   2/2004 Dervisoglu et al.
6,788,087 B2 * 9/2004 Schnabel ..................... 324/763
2002/0087284 A1   7/2002 Mueller

OTHER PUBLICATIONS

Levy, P. S., "Power-Down Structures for BIST", IEEE, Mar. 1991, pp. 266-269.

* cited by examiner

*Primary Examiner*—Vinh P. Nguyen
(74) *Attorney, Agent, or Firm*—Slater & Matsil, L.L.P.

(57) ABSTRACT

A semiconductor device with a test circuit disconnected from a power supply connection to reduce leakage current, and a method of manufacture thereof. The test circuit may be used to test functional circuits on the semiconductor device, and after the tests are completed, the test circuit is disconnected from the power supply connection. The test circuit is powered by contacting a test pad with a probe that supplies power to the test circuit, in one embodiment. In another embodiment, the test circuit is disconnected from the power supply using a laser to blow a fuse in the path of the power supply connection for the test circuit. Optional features include a bleeder device coupled to the power supply input of the test circuit, and logic circuitry for setting the outputs of the test circuit to a predetermined state coupled to the outputs of the test circuit.

45 Claims, 2 Drawing Sheets

SEMICONDUCTOR DEVICE WITH TEST CIRCUIT DISCONNECTED FROM POWER SUPPLY CONNECTION

TECHNICAL FIELD

The present invention relates generally to the design and manufacture of semiconductor devices, and more particularly to on-chip test circuits for integrated circuits.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices typically include several layers of insulating, conductive and semiconductive materials that are patterned to form integrated circuits. There may be a plurality of transistors, memory devices, switches, conductive lines, diodes, capacitors, logic circuits, and other electronic components formed on a single die or chip. Semiconductor technology has seen a trend towards miniaturization, to meet the demands of product size reduction, improved device performance, and reduced power requirements in the end applications that semiconductors are used in, for example.

Semiconductor devices are typically subjected to many tests throughout the manufacturing process to ensure that their performance meets the device requirements, before shipping them to the end customer. Some tests may be extreme, in order to weed out devices with early life failures. Tests in the industry include wafer sort, wafer acceptance test (WAT), and burn-in tests (BIT), for example. In a wafer sort, intact wafers are tested to determine which of their die are functional. Those that fail the test are marked with a drop of ink and are eventually discarded. In some applications, additional tests are required to ensure operation of the devices at high temperatures and extreme conditions (e.g., in automotive, military, or space applications).

One method of performing the tests on semiconductor devices is by using external circuits in test equipment to tests the integrated circuits. The tests may be performed by contacting the leads of the device after packaging, e.g., by plugging the packaged integrated circuits into specially designed burn-in and test sockets, or by making electrical contact to probe points, contact pads, or bond pads of the semiconductor devices before and/or after die singulation from the wafer and before or after packaging, as examples.

Some recent semiconductor device designs include on-chip test circuits that are used to perform tests. These on-chip test circuits may be used exclusively or in conjunction with external test circuits to perform a variety of tests on the semiconductor devices before either shipping to an end customer, and/or before packaging the devices, for example.

A problem with on-chip test circuits is that because they are connected to the power supply of the functional circuits on the chip, and because they include transistors and other electronic components that have leakage current when connected to a power source, they cause increased leakage current of the semiconductor device even when the on-chip test circuits are not in use, thus resulting in increased power consumption for the semiconductor device.

What is needed in the art is a method of forming an on-chip test circuit that does not increase the leakage current of semiconductor devices, and a structure thereof.

SUMMARY OF THE INVENTION

These and other problems are generally solved or circumvented, and technical advantages are generally achieved, by preferred embodiments of the present invention, which provide novel disconnectable on-chip test circuits for integrated circuits, and methods of manufacture thereof, that do not increase the leakage current of integrated circuits. The novel on-chip test circuits are disconnected from the power supply connection of the device after testing, to prevent leakage current in the test circuits, and thus reduce the amount of power required to operate the integrated circuit.

In accordance with a preferred embodiment of the present invention, a method of manufacturing a semiconductor device includes fabricating at least one first circuit on a workpiece, the at least one first circuit being coupled to a connection for a first power supply, and fabricating at least one second circuit on the workpiece. The at least one second circuit is connected to a second power supply. The first power supply is activated, and the at least one first circuit is tested. The at least one second circuit is then disconnected from the second power supply.

In accordance with another preferred embodiment of the present invention, a semiconductor device includes at least one first circuit and a connection for a first power supply coupled to the at least one first circuit. The semiconductor device includes at least one second circuit, wherein the at least one second circuit is not coupled to the connection for the first power supply.

Advantages of embodiments of the present invention include reducing the power consumption of integrated circuits by reducing the amount of leakage current on the chip. Because the test circuits are disconnected from the power supply connection, when the integrated circuit is in operation, the test circuits are not coupled to the power supply and thus do not have any leakage current. The test circuits may be reconnected to a power supply at a later time, if desired, and may be used to test the functional circuits again. Embodiments of the invention are particularly advantageous in memory applications, where a large number of test circuits may be required, and also in low power or battery-powered applications.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
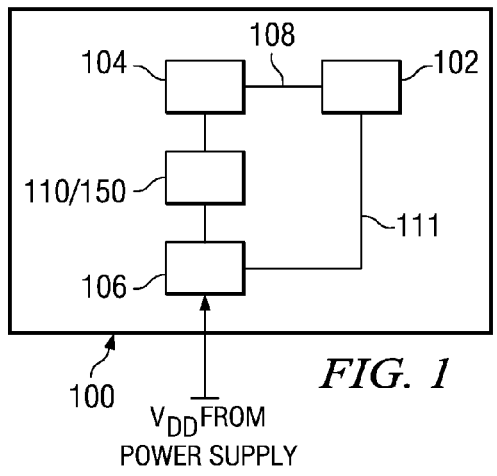
FIG. 1 shows a block diagram of a circuit in accordance with a preferred embodiment of the present invention, including a functional circuit and a test circuit coupled to a power supply connection.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Memory semiconductor devices show continuously increasing demands on transistor performance. This trend drives the utilization of transistors with ever increasing leakage currents. Also, there is a trend towards the use of increasing numbers of transistors to implement more and more complex tests and other semiconductor product features in memory semiconductor devices. In combination, these two trends create very high overall leakage currents of semiconductor devices, which deleteriously affects standby low power operation. Embodiments of the present invention address this problem and decrease leakage current of semiconductor devices.

In particular, one problem that is recognized and solved herein is that logic circuit leakage current and test related circuitry leakage current will be problematic in future memory semiconductor products. The leakage current may result in transistors from leakage through thinner gate oxide materials, or leakage from the source to the drain, as examples. Switching off or disabling on-chip test circuitry and associated logic circuits does not reduce the leakage current because the test and logic circuits remain connected to the power supply connection; thus there is leakage current through transistor channels and from source to drain of the test circuits when power is applied to the memory device, even when the device is in a standby mode.

In some memory applications, such as dynamic random access memory (DRAM) devices, about 50% of the surface area of a single die comprises memory cells, and the other 50% comprises logic circuitry. Up to about 50% or greater of the logic circuitry region, e.g., about 25% or greater of the surface area of a die, may comprise test circuitry. Each test circuit can experience leakage current: thus, leakage current can be quite large in a DRAM device.

DRAM devices typically comprise an array of memory cells that are accessible by wordlines and bitlines. There may be hundreds or thousands of tests that are performed on a DRAM device by on-chip test circuitry. For example, burn-in tests may involve testing a thousand or more DRAM devices in parallel by applying elevated voltages to the wordlines. The wordline voltage levels are artificially increased to stress the chip to accelerate aging of the DRAM device and discover early infancy failures. For example, DRAM devices may be tested at 3.5 volts, whereas normal voltages for operation may be 2.9 volts. Tests may be performed at elevated temperatures, e.g., at 125 degrees C. If shorts occur during such tests, the DRAM devices are scrapped.

There are many other tests that are performed on DRAM devices by on-chip test circuitry. The test circuitry may include logic that is adapted to activate and compress the test data, and read the data internally. The test circuits may include test mode circuits and address pattern circuitry. The test circuits may include pattern generators so that the external testers do not have to supply data to the DRAM devices during the test process. There may be ten or more test modes and hundreds of different test results for a DRAM device. In future DRAM designs, leakage currents from these test circuits may be so high that they may strongly affect the standby power of the memory devices.

Some test circuits are used, and other test circuits are not used at all, before DRAM devices are shipped to an end customer. On-chip test circuits may be used later if parts are returned, to analyze voltages and other parameters, to determine the cause of failure of a DRAM device. Test circuits may be used to test die before singulation or separation from the wafer, or test circuits may be used after packaging of the die, in a dedicated test sequence, for example.

Embodiments of the invention achieve technical advantages by reducing or eliminating leakage currents on an integrated circuit from on-chip test circuits, by disconnecting the test circuits from the power supply bus or connection. During the normal operation of the integrated circuit, the on-chip test circuits do not draw any leakage current, because the test circuits are not connected to the power supply of the integrated circuit or any other power supply.

Embodiments of the present invention will next be described with reference to a semiconductor memory device. However, embodiments of the present invention also have useful application in other types of semiconductor devices that utilize on-chip test circuitry, or that include circuits that are not used in the normal operation of semiconductor devices.

With reference now to FIG. 1, there is shown a block diagram of a semiconductor device 100, also referred to herein as an integrated circuit 100, in accordance with a preferred embodiment of the present invention. The integrated circuit 100 includes a functional circuit 102 and a test circuit 104 that may be coupled to the functional circuit 102. Only one functional circuit 102 and one test circuit 104 are shown in the figures; however, there may be a plurality of functional circuits 102 and a plurality of test circuits 104 on a single integrated circuit 100. Preferably, at least one functional circuit 102 and at least one test circuit 104 are formed on the integrated circuit 100. The integrated circuit 100 may comprise a die disposed on a semiconductor workpiece (not shown), and a plurality of integrated circuits 100 may be formed on a single semiconductor workpiece.

To manufacture the semiconductor device 100, first, a workpiece is provided. The workpiece typically comprises silicon oxide over single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

The functional circuit 102 and the test circuit 104 are fabricated on, over, or within the workpiece, or combinations thereof. For example, one or more material layers may be deposited, patterned using lithography, and/or doped to form the functional circuit 102 and the test circuit 104. The functional circuit 102 may comprise any type of circuit or combinations of circuits. In one embodiment, the functional circuit 102 preferably comprises a memory device, such as a DRAM device, a magnetic random access memory (MRAM) device, a static random access memory (SRAM) device, or a ferroelectric random access memory (FRAM) device, as examples, although alternatively, the functional circuit 102 may comprise other types of memory devices. The functional circuit 102 may also comprise a digital, analog, or power device, as examples, although alternatively, the functional circuit 102 may comprise other types of circuits. The functional circuit 102 described herein is only shown in FIG. 1 and FIG. 7; however, the test circuits 104 described and shown in FIGS. 3, 4, 5 and 6 may be coupled to the functional circuit 102, as shown in FIGS. 1 and 7 (the functional circuit 102 is not shown in FIGS. 3, 4, 5 and 6). The functional circuit 102 is also referred to herein as a first circuit, and the test circuit 104 is also referred to herein as a second circuit.

The functional circuit 102 may be coupled to the test circuit 104 by a connection 108 which may comprise a segment of conductive material in a conductive layer of the integrated circuit 100, for example. The test circuit 104 is coupled to a connection 106 for a first power supply, or is coupleable to a second power supply, by a disconnectable circuit 110 or 150, which will be described further herein with reference to FIGS. 3, 4 and 5. The functional circuit 102 may be coupled to the connection 106 for a first power supply by a connection 111. The connection 111 may comprise a segment of conductive material in a conductive layer of the integrated circuit 100, for example.

The first power supply is supplied externally to the integrated circuit 100 through the connection 106 for the first power supply by a connection for a lead, pin, or contact pad (not shown) of the integrated circuit 100 during operation or testing of the integrated circuit 100, as examples. The first power supply may comprise a voltage (VDD) of about 1 volt or less to about 15 volts, as examples, and a return (such as a ground) at about 0 voltage or a negative value of the voltage VDD, as examples, although the first power supply may alternatively comprise other voltage levels and returns. The first power supply may comprise a DC voltage or an AC voltage, as examples, depending on the application and the type of integrated circuit 100.

There is a distinction between the terms "power supply" and "connection for a power supply" used herein. The terms "power supply" and "first power supply" are used interchangeably herein and refer to a DC or AC voltage that is applied externally during test or operation to the integrated circuit 100. The power supply is represented by "VDD" in FIGS. 3, 4 and 5. The terms "connection for a power supply" or "connection for a first power supply" are used interchangeably herein. These terms as used herein refer to a power bus that is adapted to be connected or coupled to the power supply such as VDD. For example, an integrated circuit 100 may comprise several metallization layers. The connection 106 for the power supply shown in FIG. 1 may be formed in one of the metallization layers of the integrated circuit 100, e.g., the top metallization layer or other layer. The connection 106 for the power supply is electrically coupled to the plurality of memory devices or functional devices 102 on the integrated circuit 100. When the integrated circuit 100 is not in use, (e.g., not inserted into any electronic circuitry, placed in packages for shipping, or on a shelf in storage), the power supply VDD is not connected to the connection 106 for the power supply described herein.

Figure 2:
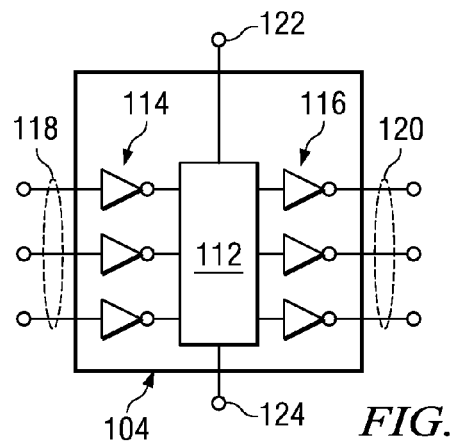
FIG. 2 shows an example of a test circuit shown in FIG. 1.

The test circuit 104 may comprise a wafer test logic circuit 104, as shown in more detail in FIG. 2. The test circuit 104 may comprise a pattern generator or other type of test circuit 104, for example, although alternatively, the test circuit 104 may comprise other types of circuits, such as mode select circuits, address select circuits, logic circuits, clock circuits, activation circuits, data compression circuits, or burn-in test circuits, as examples. The test circuit 104 may include a plurality of inputs 118, with an optional inverter 114 disposed at each input 118, as shown. The test circuit 104 may include a plurality of outputs 120, with an inverter 116 optionally disposed at each output 120, as shown. A logic circuit 112 or other circuit may be coupled between the sets of inverters 114 and 116, as shown. The inputs 118 and outputs 120 may be coupled to the functional circuit 102 shown in FIG. 1, represented by connection 108, and/or may be coupled to other on-chip test circuits 102 or contact pads that may be accessed by test probes to make electrical contact to external test circuitry, for example.

Figure 4:
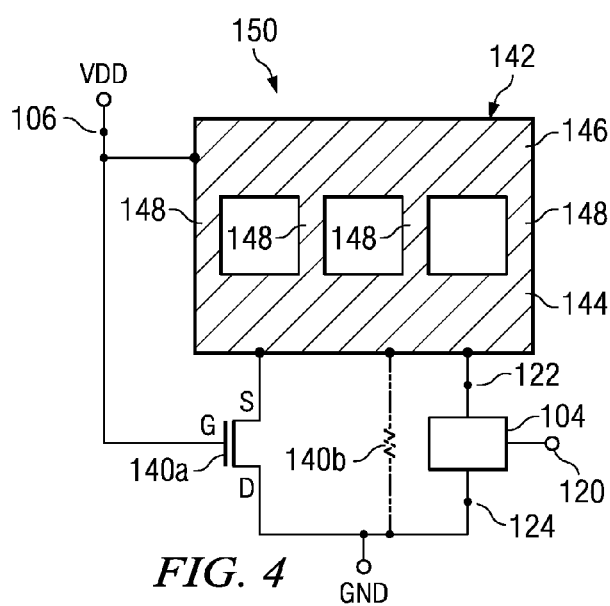
FIG. 4 shows another embodiment of the present invention, wherein a test circuit is coupled to a power supply connection using fuses which are severed using a laser after a functional circuit is tested.
Figure 5:
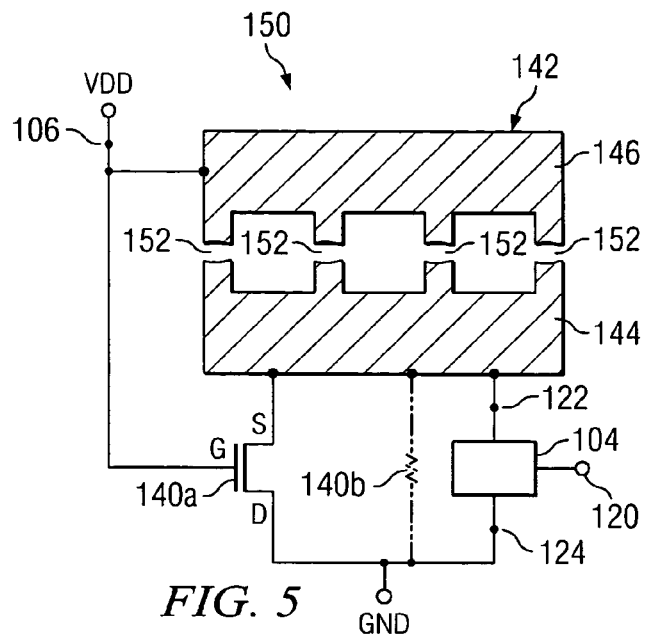
FIG. 5 shows the embodiment of FIG. 4 after the fuses have been blown or severed, disconnecting the test circuit from the power supply connection.

The test circuit 104 includes terminals to make electrical connection to a power supply, such as a power supply terminal 122 and a GND terminal 124, as shown. The power supply terminal 122 of the test circuit 104 is also referred to herein as a power supply input 122. For the test circuit 104 to function, the test circuit 104 must be connected to a power source or supply VDD, e.g., at the power supply terminal 122. However, in accordance with embodiments of the present invention, as shown in FIGS. 3, 4 and 5, the test circuit 104 is not directly coupled to the power supply, but rather, the test circuit 104 is coupled to a power supply by a disconnectable circuit 110 or 150 that can be used to disconnect the test circuit 104 from a power supply after the functional circuit 102 has been tested, to be described further herein.

Referring again to FIG. 1, in one embodiment, the functional circuit 102 is tested using the test circuit 104. In another embodiment, the functional circuit 102 is tested by either another on-chip test circuit, or by an external test circuit (not shown), rather than by the test circuit 104 shown. The test circuit 104 may comprise any circuit that is not required during normal operation of the integrated circuit 100 (FIG. 1) that would be advantageous to remove from a connection 106 to a power supply in order to reduce leakage current.

Figure 3:
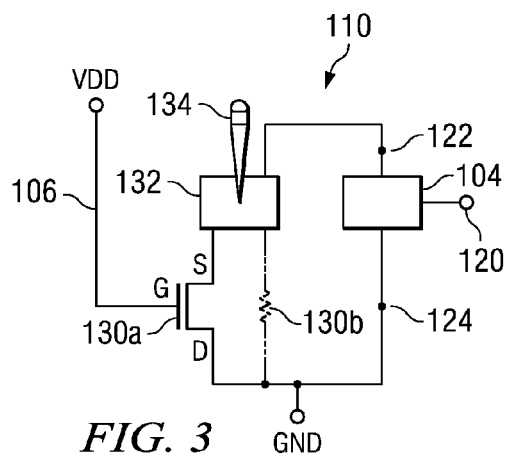
FIG. 3 illustrates a schematic of an embodiment of the present invention, wherein a test circuit is coupled to a test pad contactable by a probe that supplies power to the test circuit.

FIG. 3 shows a schematic of an embodiment of the present invention, wherein a disconnectable circuit 110 is coupled to the test circuit 104 of FIG. 2. The disconnectable circuit 110 comprises a test pad 132 for supplying power to the test circuit 104. The power supply terminal 122 of the test circuit 104 is coupled to the test pad 132 that is adapted to be contacted by a probe needle 134, for example. The probe needle 134 supplies the power (e.g., such as VDD or other voltage) to the test circuit 104 when the test circuit 104 is in use. The GND terminal 124 of the test circuit 104 is coupled to ground GND, which is a return for the first power supply VDD of the integrated circuit 100. When the test pad 132 is not being contacted by a probe needle 134 supplying power to the test circuit 104, the test circuit 104 is not powered, and leakage current cannot flow through the test circuit 104.

The power supplied by the probe needle 134 is also referred to herein as a second power supply. The second power supply may comprise the same voltage as the first power supply VDD in one embodiment, e.g., either at the same voltage level supplied by a different source than the source for the first power supply VDD, or supplied by the same voltage source as the source for the first power supply VDD. Alternatively, the second power supply may comprise a different voltage level than the first power supply VDD, for example.

The test pad 132 preferably comprises a metal or conductive pad that is adapted to be contacted by a probe needle 134. The test pad 132 may comprise a dimension of a bond pad of the integrated circuit 100, e.g., about 100×100 µm, or alternatively, the test pad 132 may comprise smaller dimensions, e.g., about 50×50 µm or less.

The disconnectable circuit 110 may include an optional bleeder device 130a or 130b, which may comprise a transistor, as shown at 130a, or alternatively, may comprise a resistor, as shown at 130b in phantom. The bleeder device 130a or 130b is preferably a highly resistive component having a resistance of several thousands or millions of ohms, e.g., preferably comprising about 1 MΩ, although alternatively, the bleeder device 130a or 130b may comprise other resistive values.

If the bleeder device comprises a transistor 130a, the transistor 130a may comprise a field effect transistor (FET) comprising a source S, a drain D and a gate G, for example, although alternatively the transistor 130a may comprise other types of transistors. The source S is preferably coupled to the test pad 132, and the drain D is coupled to ground GND. The gate G of the bleeder transistor 130a is coupled to the connection 106 for the power supply VDD of the integrated circuit 100. The bleeder transistor 130a is preferably always "on." The bleeder transistor 130a is overpowered if a probe needle 134 is applied to contact the test pad 132 and supplies a voltage. Because the bleeder transistor 130a is highly resistive, only a small amount of cross current is generated through the bleeder transistor 130a when the probe needle 134 makes contact to the test pad 132. When the probe needle 134 is removed, the bleeder device 130a stays on and drains down the probed structure to GND.

When the test pad 132 is not being contacted by a probe needle 134 supplying power to the test circuit 104, the bleeder transistor 130a prevents the voltage of the power supply terminal 122 of the test circuit 104 from floating, by bleeding the power supply terminal 122 of the test circuit 104 to ground GND. The bleeder transistor 130a ensures that if the test pad 132 is not connected to a probe needle 134, then the voltage at the test pad 132 will "bleed" down to the GND level, such that the test pad 132 will be fixed to GND if not contacted by the probe needle 134.

In the embodiment of the invention shown in FIG. 3, the disconnection circuit 110 is normally "off," and the test circuit 104 is activated only when a probe needle 134 makes contact to the test pad 132. This embodiment is advantageous because later, if the test circuit 104 is desired to be used again to test the functional circuit 102, any subsequently deposited insulating or encapsulating material may be scraped away or removed from over the test pad 132, e.g., after parts are returned from the end customer to the manufacturer, so that the test circuit 104 may be used again.

If the bleeder device comprises a resistor 130b, as shown in phantom, preferably, the resistor 130b comprises a resistance of about 1 MΩ or greater, and is coupled between the test pad 132 and ground GND, as shown. Again, the bleeder device 130b prevents the voltage level at the power supply terminal 122 of the test circuit 104 from floating.

Although optional, preferably a bleeder device 130a or 130b is included in the disconnectable circuit 110. The optional bleeder device 130a or 130b provides stability for the disconnectable circuit 110. Without a bleeder device 130a or 130b, electrostatic events or parasitic leakage paths could potentially provide an unpredictable voltage level to the "floating supply" terminals or inputs of the test circuit 104, such that the test circuit 104 could function in an undefined and/or unexpected manner.

FIG. 4 shows another embodiment of the present invention, wherein a disconnectable circuit 150 comprises one or more fuses 148 to connect a first power supply VDD to a test circuit 104, and later, after tests are performed, the test circuit 104 is disconnected from the connection 106 to the power supply VDD by blowing the fuses 148. The fuses 148 preferably comprise metal, and alternatively may comprise polysilicon or other conductive material. The fuses 148 may be part of a conductive structure 142 comprising a first region 144, a second region 146, and the fuses 148, as shown.

The first region 144 of the conductive structure 142 comprises a portion of a metallization layer or segment of conductive material that is coupled to the power supply terminal 122 of the test circuit 104, as shown. The second region 146 of the conductive structure 142 may comprise a strip of metal in the metallization layer for the first power supply VDD and may in one embodiment comprise or be coupled to the connection 106 (see FIG. 1) for the first power supply VDD of the integrated circuit 100.

A third region 148 of the conductive structure 142 preferably comprises one or more thin regions of a conductive or semiconductive material that function as fuses and that are coupled between the first region 144 and second region 146. The fuses 148 may be formed in a different metallization layer than the second region 146, for example, and may be electrically connected to the first region 144 and the second region 146 by conductive vias or plugs within insulating layers, between metallization layers. The third region 148 preferably comprises a thin region of conductive material that may be blown, severed or detached from the first region 144 and second region 146, for example, by a laser beam. The third region 148 is preferably formed in a thin metallization layer, e.g., in a metallization layer that is thinner than the metallization layer containing the connection 106 to the first power supply VDD, for example.

The fuses 148 are blown after the test circuit 104 is used to test a functional circuit 102, disconnecting the power supply terminal 122 of the test circuit 104 from the connection 106 for the first power supply VDD. This type of fuse 148 is referred to in the art as a "laser fuse", and is often used in memory devices to disable non-functioning memory cells, for redundancy repair, to trim voltage levels, and program redundancy information, as examples. Preferably the fuses 148 comprise such a laser fuse, although alternatively, the fuses 148 may comprise other types of fusable elements that are normally shorted, and that are electrically 'open' after the fuse 148 is blown, for example.

When the integrated circuit is powered on (e.g., VDD is applied or activated by connecting power to the connection 106 for the first power supply VDD), and when the fuses 148 are left intact and have not been broken or "blown", the fuses 148 make electrical connection between the first region 144 and the second region 146 of the conductive structure 142, which is coupled to VDD, and thus, the test circuit 104 is powered at the power supply terminal 122.

The disconnectable circuit 150 may comprise an optional bleeder device 140a or 140b that may comprise a transistor 140a or a resistor 140b, as shown in phantom in FIG. 4. The optional bleeder devices 140a and 140b preferably comprise similar devices and function similarly as bleeder devices 130a and 130b described with reference to FIG. 3 herein.

If the bleeder device comprises a resistor 140b, preferably the resistor 140b is coupled between the first region 144 of the conductive structure 142 and ground GND. If the bleeder device comprises a transistor 140b, the gate of the bleeder transistor 140a is coupled to the connection 106 for the first power supply VDD, and the drain of the bleeder transistor 140a is coupled to ground GND. The source S of the bleeder transistor 140a is coupled to the first region 144 of the conductive structure 142 that is coupled to the power supply terminal 122 of the test circuit 104. The bleeder transistor 140a is preferably always "on." Although optional, preferably a bleeder device 140a or 140b is used to prevent uncertainty in the operation or function of the test circuit 104.

FIG. 5 shows the embodiment of FIG. 4 after the fuses 148 have been blown (e.g., using a laser), disconnecting the test circuit 104 from the connection 106 for the first power supply VDD, e.g., leaving spaces or gaps at 152. The optional bleeder device 140a or 140b keeps the power supply terminal 122 of the test circuit 104 from floating and prevents unpredictable function of the test circuit 104.

In the embodiment shown in FIGS. 4 and 5, the test circuit 104 is unable to be used again after the fuses 148 have been blown. However, the test circuit 104 or functional circuit 102 may be opened up at any location and probed, for example.

Figure 6:
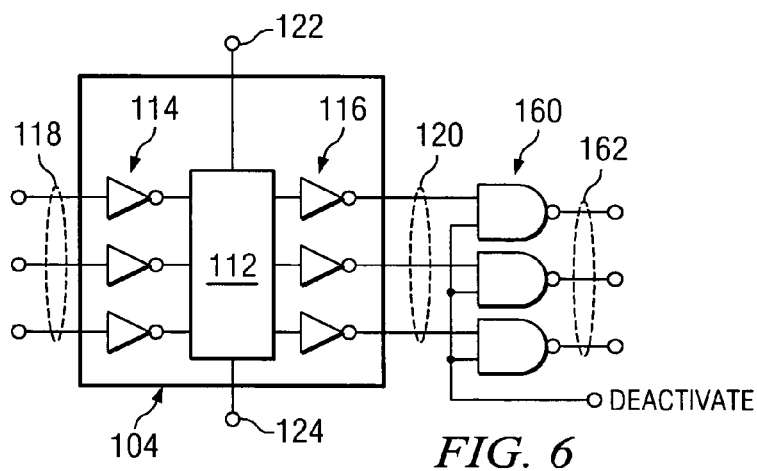
FIG. 6 shows an optional embodiment of the present invention that may be used in conjunction with the embodiments shown in FIGS. 3, 4 and 5, wherein logic circuitry is used to deactivate outputs of the test circuit.
Figure 7:
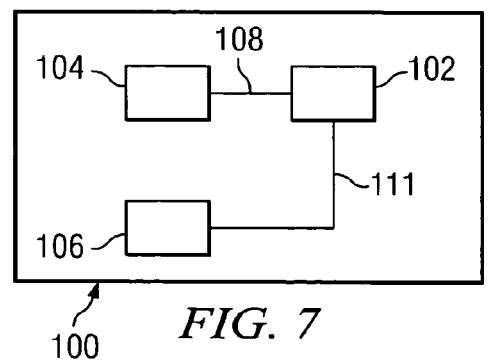
FIG. 7 shows the block diagram of FIG. 1 after the test circuit has been disconnected from the power supply connection in accordance with embodiments of the present invention.

FIG. 6 shows an optional logic circuit 160 that may be implemented in either the embodiment shown in FIG. 3, or the embodiment shown in FIGS. 4 and 5. If a bleeder device 130a, 130b, 140a, or 140b is not desired or is not used, the optional logic circuit 160 can be used to protect the outputs 120 from floating, by setting the outputs 120 to a predetermined state, e.g., either high or low, or alternatively, the outputs 120 may be set to a tri-state, e.g., a high impedance state, wherein the outputs 120 are highly resistive and do not drive to any level. The appropriate state of the outputs 120 is a function of the design of the use of the various signals in the logic circuit 160. In the example shown in FIG. 6, the outputs 162 are set to a high level if the signal "deactivate" is low.

For example, the logic circuit 160 may be coupled to the outputs 120 of the test circuit 104, as shown in FIG. 6. The logic circuitry 160 is used to to set the outputs 162 into a defined state, keeping the outputs 162 of the logic circuitry 162 high, as an example, although alternatively, the outputs 162 may be set low, as another example. In the embodiment shown, each output 120 of the test circuit 104 is coupled to a first input of a NAND gate, as shown. The second input of each NAND gate is coupled to a "deactivate" signal, as shown. The "deactivate" signal may then be used to set the outputs 120 of the test circuit 140 to a predetermined state, preventing outputs from accidentally interfering with overall integrated circuit 100 logic operation. Alternatively, the circuit 160 may comprise other circuit structures than can set the outputs 162 of the circuit 160 to a predetermined state, e.g., into a tri-state or highly resistive output mode.

The optional logic circuit 160 for deactivating the test circuit outputs 120 shown in FIG. 6 is advantageous when implemented with the embodiment shown in FIG. 3, because the test circuit 140 may be utilized later, if desired, using addressing (e.g., a designated predetermined address) to change the deactivate signal.

FIG. 7 shows the block diagram of FIG. 1, after the test circuit 104 has been disconnected from the power supply 106 in accordance with embodiments of the present invention, using a test pad 132 (FIG. 3) or fuse 148 (FIGS. 4 and 5), preferably in combination either with a bleeder device 130a, 130b, (FIG. 3) 140a, or 140b, (FIGS. 4 and 5) and/or a logic circuit 160 (FIG. 6) coupled to the outputs 120 of the test circuit 140.

In the embodiments described herein, the test circuit 104 is used to test the functional circuit 102, and then the test circuit 104 is disconnected from the first power supply VDD or second power supply provided by probe 134. However, alternatively, the functional circuit 102 may comprise a first circuit, and the test circuit 104 may comprise a second circuit. The second circuit 104 may be used to test the first circuit 102, or alternatively, the second circuit 104 may be used for other purposes while the second circuit 104 is connected to the power supply VDD or power supply provided by probe 134. For example, the second circuit 104 may be used as a temporary memory or storage function while tests are performed on the first circuit 102 or other circuits on the integrated circuit 100. However, at some point before the manufacturing of the integrated circuit 100 is completed, the second circuit 104 connection 106 to the power supply is disconnected, using the embodiments of the present invention described herein, by blowing fuses 148, disconnecting the power supply terminal 122 of the second circuit 104 from the connection 106 for the first power supply VDD as described with reference to FIGS. 4 and 5, or by removing the probe needle 134 supplying the second power supply to the power supply terminal 122 of the second circuit 104, as described with reference to FIG. 3.

In one embodiment, shown FIGS. 4 and 5, the disconnection of the test circuit 104 from the power supply connection 106 is permanent and is irreversible. However, in the embodiment shown in FIG. 3, the disconnection of the test circuit 104 from power is reversible and may be reversed either by the end user, or by the manufacturer to analyze product defects or failures of returned integrated circuits 100, as examples. For example, power may be supplied to the test circuit 104 using probes 134, or a predetermined address may be used to activate the test circuit 104. Memory devices such as DRAM devices, for example, are designed and manufactured according to industry specifications such as those set by the Joint Electron Device Engineer Council (JEDEC), which include definitions for particular sequences to activate test modes. However, unused or undefined addresses or sequences of a memory device may be utilized to provide access to the test circuits 104 disconnected from the power supply, for example.

Embodiments of the present invention are described herein with reference to memory semiconductor devices. However, embodiments of the present invention are also useful in other semiconductor device applications. The circuit 104 that is disconnected from the power supply connection is described herein as a test circuit 104; however, the circuit 104 disconnected from the power supply connection may also comprise logic or other types of circuitry, for example.

Advantages of embodiments of the present invention include reducing the power consumption of integrated circuits 100 by reducing the amount of leakage current in the chip 100. Test circuits 104 are isolated after testing and before the shipment of the end product, preventing leakage current in the test circuits 104. Because the test circuits 104 are disconnected from the power supply connection 106, when the integrated circuit 100 is in operation, the test circuits 104 are not coupled to the power supply VDD and thus do not draw any leakage current. In one embodiment, the test circuits 104 may be reconnected to a power supply VDD at a later time if desired, and may be used to test the functional circuits again. Embodiments of the invention are particularly advantageous in memory applications, where a large number of test circuits 104 may be required, and also in low power or battery applications.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing a functional circuit, comprising:
   providing a workpiece with the functional circuit and a testing circuit disposed thereon, wherein the functional circuit is coupled to and receives operating power from a first power supply;
   applying an operating voltage to the testing circuit for providing operating power to said testing circuit;
   testing the functional circuit with the testing circuit; and
   removing the operating voltage from the testing circuit after said functional circuit has been tested.

2. The method of claim 1, wherein applying the voltage to the testing circuit comprises contacting a pad that is coupled to a power supply terminal of the testing circuit with a probe that is coupled to the voltage.

3. The method of claim 2, wherein removing the voltage from the testing circuit comprises removing the probe from contact with the pad.

4. The method of claim 1, wherein removing the voltage from the testing circuit comprises applying a resistance between the pad and a ground potential.

5. The method of claim 4, wherein the voltage is removed through a transistor.

6. The method of claim 1, wherein the workpiece also includes a logic circuit that is coupled between the functional circuit and the testing circuit, the method further comprising:
   setting one or more outputs of the logic circuit to a predetermined state after the functional circuit has been tested with the testing circuit.

7. The method of claim 1, wherein the operating voltage applied to the testing circuit is provided by the first power supply.

8. The method of claim 1, wherein the voltage applied to the testing circuit is provided by a second power supply.

9. The method of claim 1, wherein providing the workpiece comprises fabricating the functional circuit and the testing circuit on the same semiconducting material.

10. The method of claim 1, wherein providing the workpiece comprises fabricating the functional circuit and the testing circuit on a single semiconductor die.

11. The method of claim 1, wherein the functional circuit comprises a plurality of memory devices, and wherein testing the functional circuit with the testing circuit comprises testing the plurality of memory devices in parallel.

12. The method of claim 1, wherein the functional circuit comprises a plurality of logic devices, and wherein testing the functional circuit with the testing circuit comprises testing the plurality of logic devices in parallel.

13. The method according to claim 1:
   applying a voltage to the testing circuit comprises applying a voltage to a power supply terminal of the testing circuit;
   removing the voltage from the testing circuit comprises removing the voltage from the power supply terminal by opening at least one fuse.

14. The method of claim 13, wherein opening the at least one fuse comprises applying energy from a laser to the at least one fuse.

15. The method of claim 13, wherein removing the voltage from the testing circuit comprises applying a resistance between the power supply terminal and a ground potential.

16. The method of claim 15, wherein the resistance is removed through a transistor.

17. The method of claim 13, wherein the workpiece further includes a logic circuit coupled between the functional circuit and the testing circuit, the method further comprising:
   setting one or more outputs of the logic circuit to a predetermined state after the functional circuit has been tested with the testing circuit.

18. The method of claim 13, wherein the voltage applied to the testing circuit is provided by the first power supply.

19. The method of claim 13, wherein the voltage applied to the testing circuit is provided by a second power supply.

20. The method of claim 13, wherein providing the functional circuit and the testing circuit on a workpiece comprises fabricating the functional circuit and the testing circuit on a same semiconducting material.

21. The method of claim 13, wherein providing the functional circuit and the testing circuit on the workpiece comprises fabricating the functional circuit and the testing circuit on a die.

22. The method of claim 13, wherein the functional circuit comprises a plurality of memory devices, and wherein testing the functional circuit with the testing circuit comprises testing the plurality of memory devices in parallel.

23. The method of claim 13, wherein the functional circuit comprises a plurality of logic devices, and wherein testing the functional circuit with the testing circuit comprises testing the plurality of logic devices in parallel.

24. The method of claim 1, wherein testing the functional circuit and removing the operating voltage from the testing circuit comprises selectively coupling said operating voltage to a power supply terminal of the testing circuit so that the testing circuit can test the functional circuit when the voltage is coupled to the power supply terminal and removing said operating voltage from said power supply terminal when the functional circuit is not being tested by the testing circuit.

25. The method of claim 24, wherein selectively coupling the voltage comprises receiving a probe at a probe pad of the workpiece, the probe coupling the voltage to the contact pad, wherein the testing circuit is capable of testing the functional circuit when the voltage is coupled to the contact pad.

26. The method of claim 25, further comprising causing charge to bleed between the contact pad and a ground connection.

27. The method of claim 26, wherein the charge is caused to bleed through a transistor coupled between the contact pad and the ground connection.

28. The method of claim 26, wherein the charge is caused to bleed through a resistor coupled between the contact pad and the ground connection.

29. The method of claim 25, the workpiece further includes a logic circuit disposed thereon, the logic circuit being coupled between the functional circuit and the testing circuit, the method further comprising:
  setting one or more outputs of the logic circuit to a predetermined state when the testing circuit is not testing the functional circuit.

30. The method of claim 25, wherein the workpiece comprises a semiconducting material.

31. The method of claim 25, wherein the workpiece comprises a die.

32. The method of claim 25, wherein the functional circuit comprises at least one memory device.

33. The method of claim 25, wherein the functional circuit comprises at least one logic device.

34. The method of claim 24, wherein selectively coupling said operating voltage comprises utilizing a fuse coupled between an operating voltage source and the power supply terminal, wherein the functional circuit, the testing circuit and the fuse are disposed on the workpiece.

35. The method of claim 24, wherein coupling said operating voltage to the power supply terminal comprises providing the operating voltage from a power supply disposed on the workpiece.

36. The method of claim 24, wherein coupling the voltage to the power supply terminal comprises providing the voltage from a second power supply, the second power supply remote from the workpiece.

37. The method of claim 24, wherein removing the voltage comprises blowing a fuse.

38. The method of claim 24, further comprising causing charge to bleed between the contact pad and a ground connection.

39. The method of claim 38, wherein the charge is caused to bleed through a transistor coupled between the contact pad and the ground connection.

40. The method of claim 38, wherein the charge is caused to bleed through a resistor coupled between the contact pad and the ground connection.

41. The method of claim 24, the workpiece further includes a logic circuit disposed thereon, the logic circuit being coupled between the functional circuit and the testing circuit, the method further comprising:
  setting one or more outputs of the logic circuit to a predetermined state when the testing circuit is not testing the functional circuit.

42. The method of claim 24, wherein the workpiece comprises a semiconducting material.

43. The method of claim 24, wherein the workpiece comprises a die.

44. The method of claim 24, wherein the functional circuit comprises at least one memory device.

45. The method of claim 24, wherein the functional circuit comprises at least one logic device.

* * * * *